United States Patent [19]

Schmidt

[11] Patent Number: 5,122,687
[45] Date of Patent: Jun. 16, 1992

[54] SYMMETRICAL EXCLUSIVE-OR GATE, AND MODIFICATION THEREOF TO PROVIDE AN ANALOG MULTIPLIER

[75] Inventor: Lothar Schmidt, Bochum, Fed. Rep. of Germany

[73] Assignee: Ant Nachrichtentechnik GmbH, Backnang, Fed. Rep. of Germany

[21] Appl. No.: 585,105
[22] PCT Filed: Jul. 15, 1989
[86] PCT No.: PCT/DE89/00470
§ 371 Date: Oct. 2, 1990
§ 102(e) Date: Oct. 2, 1990
[87] PCT Pub. No.: WO90/02451
PCT Pub. Date: Mar. 8, 1990

[30] Foreign Application Priority Data

Aug. 27, 1988 [DE] Fed. Rep. of Germany ....... 3829164

[51] Int. Cl.$^5$ ................... G06F 7/50; H03K 19/21
[52] U.S. Cl. ..................... 307/471; 364/784
[58] Field of Search ............. 307/454, 455, 443, 446, 307/467, 355, 362, 475, 471, 558, 544; 364/784

[56] References Cited

U.S. PATENT DOCUMENTS

| | | | |
|---|---|---|---|
| 3,649,844 | 3/1972 | Kroos | 307/471 |
| 3,838,393 | 9/1974 | Dao | 307/471 X |
| 4,041,326 | 8/1977 | Robinson | 307/471 |
| 4,408,134 | 10/1983 | Allen | 307/471 |
| 4,718,035 | 1/1988 | Hara et al. | 307/471 X |
| 4,810,908 | 3/1989 | Suzuki et al. | 307/471 X |
| 4,831,579 | 5/1989 | Hara et al. | 307/471 X |
| 4,900,954 | 2/1990 | Franz et al. | 307/471 X |
| 4,924,117 | 5/1990 | Tamaru | 307/471 X |

OTHER PUBLICATIONS

Elektronik, vol. 36, No. 19, Sep. 18, 1987 (München, DEX) I. Martiny "Grundschaltungen . . . ", pp. 140-146, FIG. 10.

Primary Examiner—Edward P. Westin
Assistant Examiner—David R. Bertelson
Attorney, Agent, or Firm—Spencer, Frank & Schneider

[57] ABSTRACT

An Exclusive-Or circuit has a symmetrical arrangement of components in order to provide an identical input impedance for both input signals and to provide identical switching and signal propagation times. The circuit includes input stages ($EF_1$, $EF_2$; $EF_3$, $EF_4$) for receiving first and second input signals ($V_{E1}$; $V_{E2}$) and emitter followers ($EF_5$, $EF_6$, $EF_7$, $EF_8$) connected to the input stages. A current switch stage ($T_{11}$, $T_{12}$, $T_{13}$, $T_{14}$) is driven by the input stage for the first input signal, and an identical current switch stage ($T_{21}$, $T_{22}$, $T_{23}$, $T_{24}$) is driven by the input stage for the second input signal. These current switch stages are connected by load resistors ($R_1$, $R_1$) to one pole of an operating voltage source ($U_B$). Another current switch stage ($T_{15}$, $T_{16}$), is connected between a current source ($I_O/2$) and the current switch stage ($T_{11}$, $T_{12}$, $T_{13}$, $T_{14}$) that is driven by the input stage for the first input signal, and another identical current switch stage ($T_{25}$, $T_{26}$) is connected between a further current source ($I_O$ 2) and the current switch stage ($T_{21}$, $T_{22}$, $T_{23}$, $T_{24}$) that is driven by the input stage for the second input signal. These current switch stages ($T_{15}$, $T_{16}$, $T_{25}$, $T_{26}$) are driven by the emitter followers ($EF_5$, $EF_6$; $EF_7$, $EF_8$) that are connected to the input stages. The current sources are connected to the other pole of the operating voltage source ($U_B$). A buffer stage ($EF_9$, $EF_{10}$, $EF_{11}$, $EF_{12}$) connects the load resistors to a current switch ($T_8$, $T_9$) which provides the output signal ($U_A$). An analog multiplier can be made by modifying this circuitry.

19 Claims, 3 Drawing Sheets

SYMMETRICAL EXCLUSIVE-OR GATE, AND MODIFICATION THEREOF TO PROVIDE AN ANALOG MULTIPLIER

BACKGROUND OF THE INVENTION

The invention relates to a circuit arrangement for the EXCLUSIVE-OR linkage of two signals.

U.S. Pat. No. 4,408,134 discloses an XOR gate using ECL [emitter coupled logic] technology in which two inputs A and B are connected with the base terminals of current switching transistors in of superposed pairs of current switches (21, 24 and 25 in FIG. 2 of the patent). The bases of the respective other current switching transistors (22, 23 and 26) are connected with internal reference voltage sources ($V_{BB1}$ and $V_{BB2}$, respectively). The collector currents of transistors 21 and 23 flow through a common load resistance element 28 at which a voltage signal is dropped that represents the EXCLUSIVE-OR linkage of the signals present at inputs A and B. This output signal travels via an emitter follower 27 to the output node 17 of the XOR gate.

An improved circuit arrangement for the EXCLUSIVE-OR linkage of two signals is shown in FIG. 1. This arrangement is configured in emitter-emitter coupled logic (ECL) technology. But this improved arrangement also has some drawbacks. In order to make these drawbacks clearer in the discussion below, brief reference will be made to the purpose of the individual function blocks.

A first input stage for input signal $U_{E1}$ is composed of input transistors $EF_1$ and $EF_2$ as emitter followers. A second input stage for input signal $U_{E2}$ includes two input transistors $EF_3$ and $EF_4$, each connected, at a diode $D_1$ and $D_2$, respectively, to an emitter follower $EF_7$ and $EF_8$, respectively. The input stages serve for level matching as well as decoupling of the actual XOR gate from the enabling or driving circuit. The transistors of the input stages each have their collectors connected to ground and, by way of their emitter resistances $R_2$, $R_3$ and $R_4$, to the negative pole of an operating voltage source $U_B$. The actual XOR gate is composed of current switches which are superposed on one another (series gating). Because of this serial connection, a shift in level is necessary between the two input signals of the actual XOR gate. This is accomplished by the pair of diodes $D_1$, $D_2$ and a pair of emitter followers $EF_7$ and $EF_8$. In the illustrated embodiment, the potential difference between the two internal signal planes is thus twice the base-emitter voltage.

The mentioned current switches including transistors $T_1$ to $T_6$ serve to establish a logic linkage of the two input signals. The lower pair of current switches including transistors $T_5$ and $T_6$ are coupled together at their emitters and connected via a current source $I_O$ with the negative pole of the operating voltage source $U_B$. The base inputs are enabled or driven by the outputs of emitter followers $EF_7$ and $EF_8$, respectively. An upper pair of further current switches is connected to each one of the two collector outputs $i_5$ and $i_6$. The two base inputs of the first pair $T_1$, $T_2$ are enabled or driven by the emitter outputs of the first input stage $EF_1$ and $EF_2$, respectively, while the base inputs of the second pair $T_3$, $T_4$ are enabled inversely thereto by the emitter outputs of the same mentioned input stage. The four collector outputs of the two upper current switch pairs are connected in parallel by pairs, $i_1$ with $i_3$ and $i_2$ with $i_4$, and are each connected via load resistance elements $R_1$ with ground potential (positive potential) of the operating voltage source $U_B$. The difference output signal can be picked up at these load resistance elements $R_1$. In order to regenerate the signal levels and to decouple the actual XOR gate from the output, a buffer stage is provided subsequently which, in the illustrated example, is composed of two pairs of emitter followers $EF_9$, $EF_{11}$ and $EF_{10}$, $EF_{12}$ having emitter resistances $R_5$, $R_6$; $R_5$, $R_6$ that are connected with the negative pole of the operating voltage source. The buffer stage is connected to a current switch including the likewise emitter-coupled transistors $T_8$, $T_9$ whose common emitter is connected, via a current source controlled by a control voltage $U_{ref}$, with the negative pole of the operating voltage source $U_B$. A transistor $R_{10}$ and a resistor $R_7$ are connected in series to provide the current source. The two collector outputs of $T_8$ and $T_9$ have external load resistances $2 \times R_8$ that are connected with ground potential.

If the signal level at one input of the XOR gate changes while the level at the other input remains constant, the voltage at the output of the XOR gate changes; if both input levels are switched simultaneously, the output signal of an ideal XOR circuit is not influenced. Since, however, during switching the difference voltage at the current switch inputs of both signal planes temporarily takes on a value of 0 volt, the current $I_O$ at this moment flows through the two load resistance elements $R_1$ in equal parts. Thus the magnitude of the XOR output voltage is reduced before the original positive or negative maximum output voltage value is reestablished. In the most unfavorable case, the difference output voltage collapses to 0 volt.

The disadvantages of the XOR gate become evident in the following different applications.

1. Frequency Dependent Differences In Delay Between The Signal Planes

The logic linkage of the input signals takes place in transistors $T_1$ to $T_4$. The signals there flow over two different paths. While one input signal reaches the bases of $T_1$ and $T_4$ via emitter follower $EF_1$ and the bases of $T_2$ and $T_3$ via $EF_2$, respectively, the other input signal flows via $EF_3/D_1/EF_7$ and $T_5$ to the emitters of $T_1/T_2$ and via $EF_4/D_2/EF_8$ and $T_6$ to the emitters of $T_3/T_4$. Due to the finite switching speed of the transistors, the delay on the different signal paths becomes different.

Thus, a delay difference $t_L$ results between the signals to be linked which, in the different possible uses of the XOR gates, has the following effect:

1.1 For frequency doubling, periodic signals having merely a suitable phase difference are applied to the two inputs of the XOR gate, for example:

$$u_{E1} = U_1 \cdot \sin \omega t$$

$$u_{E2} = U_1 \cdot \sin |\omega t - \phi|.$$

The differences in delay of the input signals as a result of the different signal paths in the XOR gate can be described by an additional phase angle $\xi$ between the input signals if one wishes to consider the XOR gate to be ideal with reference to differences in delay. Since, however, the difference in delay is also a function of the circuit frequency, $\xi = f(\omega)$. If $$\phi - \xi(\omega) = (2n-1) \cdot \pi/2$$

the XOR gate exhibits the ideal behavior during frequency doubling. Only in this case is the output signal of the XOR gate free of direct voltage so that the desired keying ratio of 1:1 results. Thus, in order to realize optimum operation of the gate as a frequency doubler, the phase angle $\phi$ between the input signals must be set as a function of the operating frequency. This, however, is hardly possible, particularly if the enabling circuits are monolithically integrated.

1.2 Differentiating and Rectifying

For differentiating and rectifying any desired bit sequence is fed directly to one XOR input and the same bit sequence is fed with a delay to the other XOR input. The output signal level thus changes for each edge of the input signal so that clock recovery from the bit sequence is possible. In this use, the described XOR gate has the following drawbacks. The ascending edge and the descending edge of the output signal have different edge steepnesses since the signal paths to the upper and lower current switching plane exhibit different lowpass behavior. The curve shape of the output signal may thus become asymmetrical and depends on which signal plane is enabled directly and which with a delay.

1.3 Use as Phase Detector

If one enables the XOR gate as described above in subsection 1.1, the output direct voltage is a measure for the phase shift between the two input clock signals:

$$u_{A-} = U_{A,0} \cos \cdot |\phi - \xi(\omega)|.$$

The maximum sensitivity, $u_{A-}/d\phi$, occurs for $\phi - \pi/2 + \xi(\omega)$. Because of the frequency dependent difference in delay, the point of symmetry of the function $u_{A-} = f(\omega)$ is also frequency dependent.

1.4 Logic Linkage of Bit Sequences

If one places any desired bit sequences at the two XOR inputs, the XOR output voltage is permitted to change its level if only one of the two input voltages changes. The difference $\Delta t_L$ in delay between the different signal paths as already defined in section 1 results in a corresponding jitter in the output signal which, due to the frequency dependency, cannot be compensated over a broad band.

As discussed in subsection 1.2, the edge steepness of the output signal may additionally be dependent on the current switching plane in which the switching takes place.

2. Input Impedance

Due to the asymmetry of the circuit, the two XOR inputs have different input impedances. As a result of this, the input signal sources are subjected to different loads. Moreover, the reflection factors of the two inputs differ.

SUMMARY OF THE INVENTION

It is therefore been an object of the invention to provide a circuit arrangement of the above-mentioned type which is able to eliminate the described drawbacks, without the costs being too high.

The EXCLUSIVE-OR gate according to the invention has the advantages that both input stages have the same input impedances and that switching and signal delay times are identical.

The invention is based on the fundamental idea that the above-mentioned XOR gate should be constructed completely symmetrically. In detail, the input stages of the XOR gate according to the invention are configured in such a manner that both input signals are applied to an upper current switching plane and with shifted levels, to a lower current switching plane. In this way, it is ensured that both inputs have the same input impedance. On the other hand, the upper stage of the XOR gate, in which the logic linkage takes place, is provided twice. Due to the double provision of the linkage stages, it becomes possible that, for every change in levels, an upper as well as a lower current switching plane is switched at an XOR input. Thus the same switching and signal delay times are realized, independently of at which input the change in levels takes place.

DESCRIPTION OF THE PREFERRED EMBODIMENTS

Figure 1:
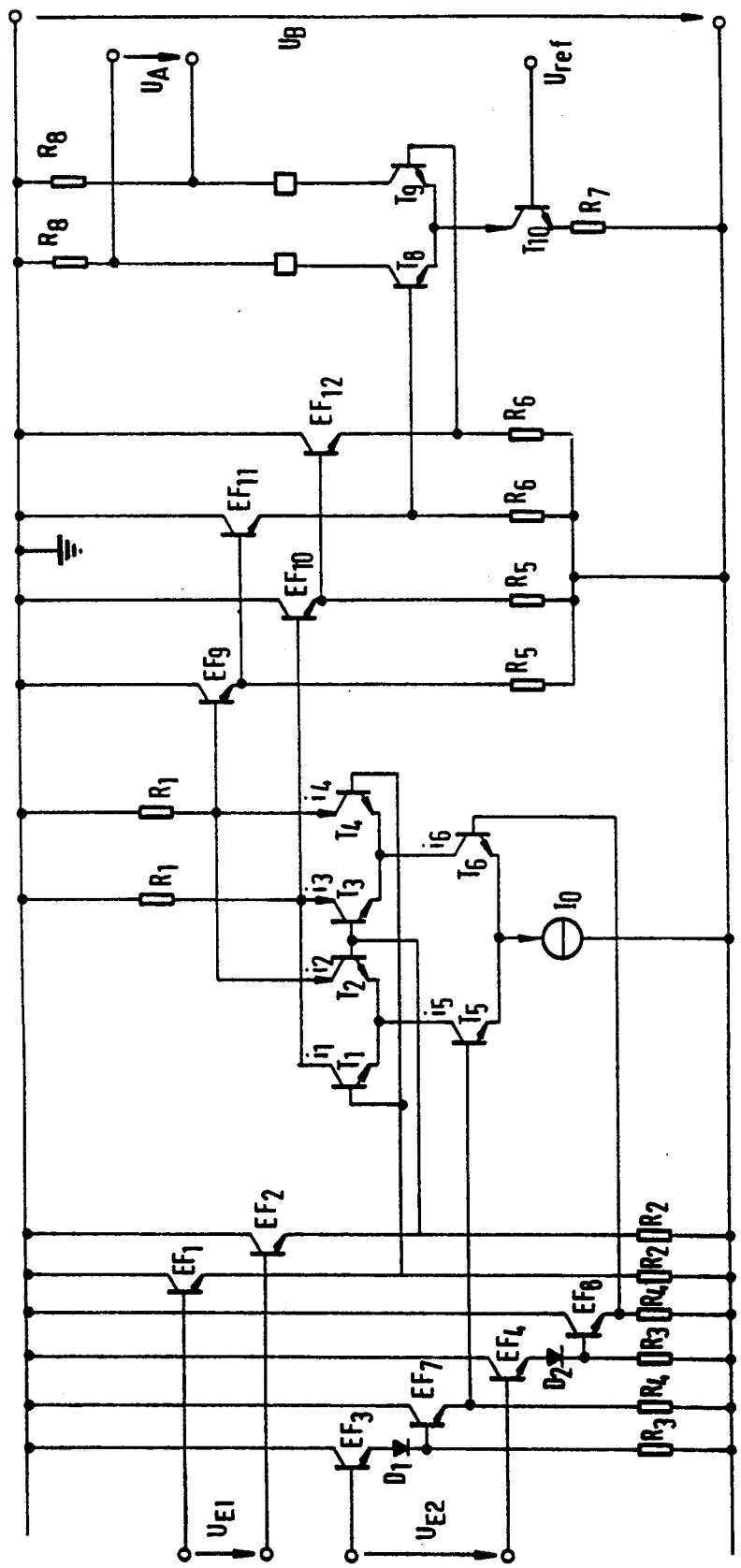
FIG. 1 is a circuit diagram of an Exclusive-Or gate that is described in the initial portion of this document.
Figure 2:
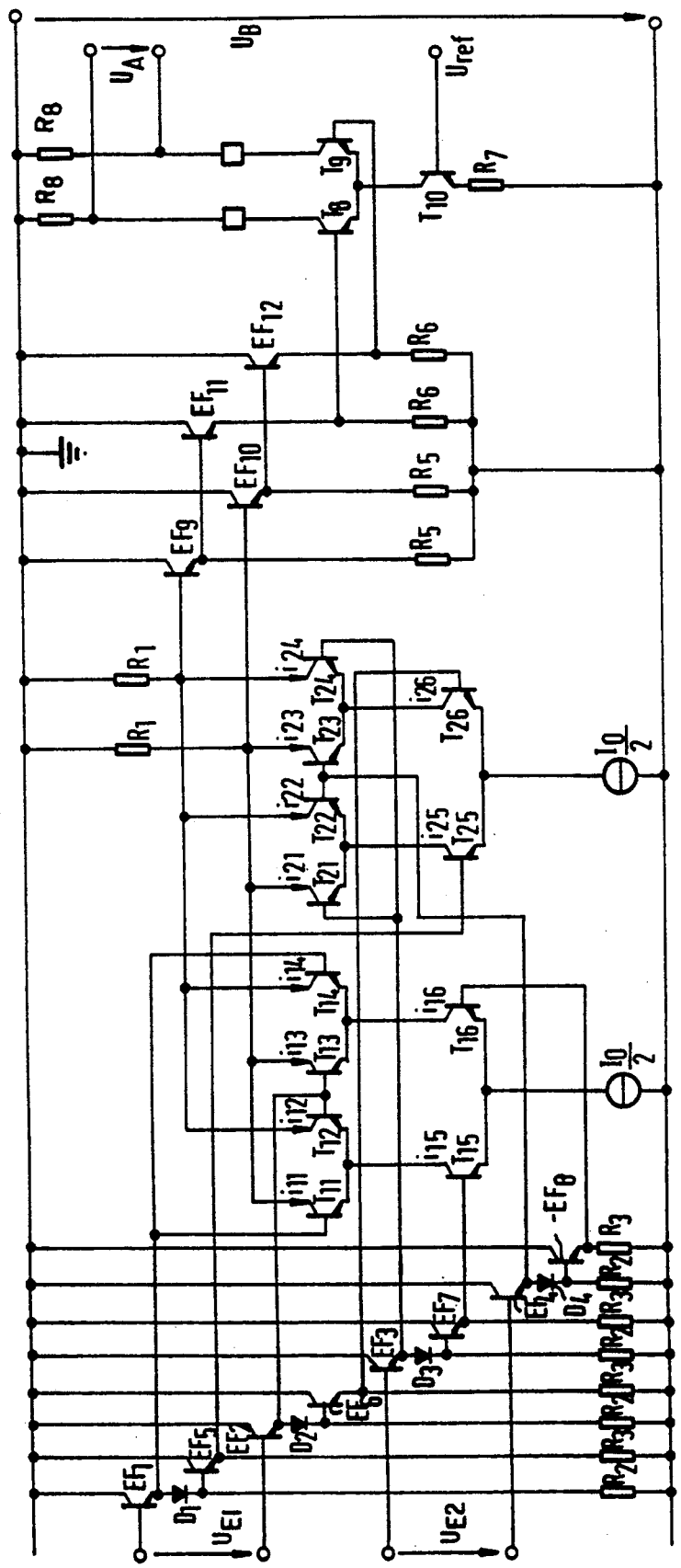
FIG. 2 is a circuit diagram of an Exclusive-Or gate in accordance with an embodiment of the invention.

FIG. 2 presents a complete circuit diagram for one embodiment of an XOR gate according to the invention. FIG. 2 includes the components of the XOR gate of FIG. 1 (which has already been discussed), with most of the reference numerals having been retained.

As will be seen from FIG. 2, the upper input stage for the first input signal $u_{E1}$ includes input transistors $EF_1$ and $EF_2$ is also provided with subsequent emitter followers $EF_5$ and $EF_6$ which are coupled in by way of diodes $D_1$ and $D_2$. The emitter resistances, $R_2$ for the input transistors and $R_3$ for the emitter followers, are identical in each case. This structure makes the input stages symmetrical and they thus offer the same input impedances. In addition to the actual XOR gate, a second, identically constructed gate is provided, with the two outputs being connected in parallel. The enabling or driving of this second current switch group takes place in the same manner as that of the first group, in that now additionally the lower pair of current switches $T_{25}$ and $T_{26}$ of the second XOR gate are enabled by the two outputs of the additionally provided emitter followers of the upper input stage $EF_5$ and $EF_6$, respectively. In a corresponding manner, the base inputs of the two upper current switch pairs $T_{21}$, $T_{22}$ and $T_{23}$, $T_{24}$, respectively, of the second XOR gate are enabled by the emitter outputs of the input transistors $EF_3$ and $EF_4$, respectively, of the lower input stage.

According to the embodiment shown in FIG. 2, the load resistances $R_1$ for both linkage stages are the same and the feeding current sources are correspondingly each designed for half the current $i_0/2$. The output buffer corresponds in configuration and function to the output buffer of the XOR gate of FIG. 1.

The advantages of the XOR gate according to the invention, in detail, are as follows:

1. Use Of The XOR Gate As A Frequency Doubler

If the XOR gate is used as a frequency doubler (input voltages $u_{E1}$ and $u_{E2}$ per definition in subsection 1.1 in the initial portion of this document) an output voltage is obtained which, in the ideal case, is free of direct voltage and its keying ratio is 1:1.

If one considers the difference in delay between the input signals caused by the different signal paths in the upper and lower current switching planes by providing an additional phase angle, the following relationship can be derived for the direct output voltage $u_A =$ if the double XOR gate is employed as a frequency doubler (see the diploma paper by L. Schmidt):

$$u_{A=} = U_{A,O} \cos \phi \cos |\xi(\omega)|$$

For $\phi = (2n-1) \cdot \pi/2 (n=0, \pm 1, \pm 2, \ldots)$, the output signal becomes free of direct voltage, independent of the frequency of the circuit!

2. Differentiating And Rectifying

If the XOR gate is employed for differentiating and rectifying any desired bit sequence, the above described drawbacks of the XOR gate no longer apply. The ascending and descending edges here have the same edge steepness because for each switching process a lower current switching plane as well as an upper current switching place are switched; that is, the RC time constants and the transistor switching times of both signal paths influence both edges of the output signal in the same manner. A consequence of this is also that the output signal has uniform edge steepnesses and the curve shape of the output signal is independent of which of the two double XOR inputs is enabled directly and which one with a delay.

3. Use of the XOR Gate as Phase Detector

If one enables the XOR gate with a periodic signal so that only a phase shift results between the otherwise identical XOR input voltages, the value given in Equation (2) results for the direct voltage component $u_{A=}$ of the output signal. Although the maximum sensitivity $du_{A=}/d\phi$, which occurs at $\phi = \pi/2$, is less by a factor of $\cos |\xi(\omega)|$ than for a standard XOR gate, it is frequency independent in contrast to such a gate. Thus the point of symmetry of the function $u_{A=} = f(\phi)$ is also frequency independent.

4. Logic Linkage Of Bit Sequences

Since in the XOR gate switching always occurs in an upper current switching plane as well as in a lower current switching plane, independently of which one of the two input voltage levels changes, the signal delay between reception and output is constant.

Therefore, the frequency dependent delay difference between the signals in the upper and lower current switching planes of the linkage stages here does not lead to jitter in the output signal.

With a fully symmetrical XOR gate, the edge steepness of the output signal is always the same, independently of which XOR input changes level. However, it is somewhat less steep than for a standard XOR.

Compared to the XOR gate of FIG. 1, the gate according to FIG. 2 thus proves to be advantageous for all of the above-mentioned typical XOR applications. Yet, the added number of switching elements required does not constitute a significant disadvantage in monolithic integration. The somewhat reduced edge steepness mentioned in section 4 can be compensated for at the output of the linkage stage by an additional steepness-increasing stage.

5. Use Of The XOR Gate As Multiplier

Figure 3:
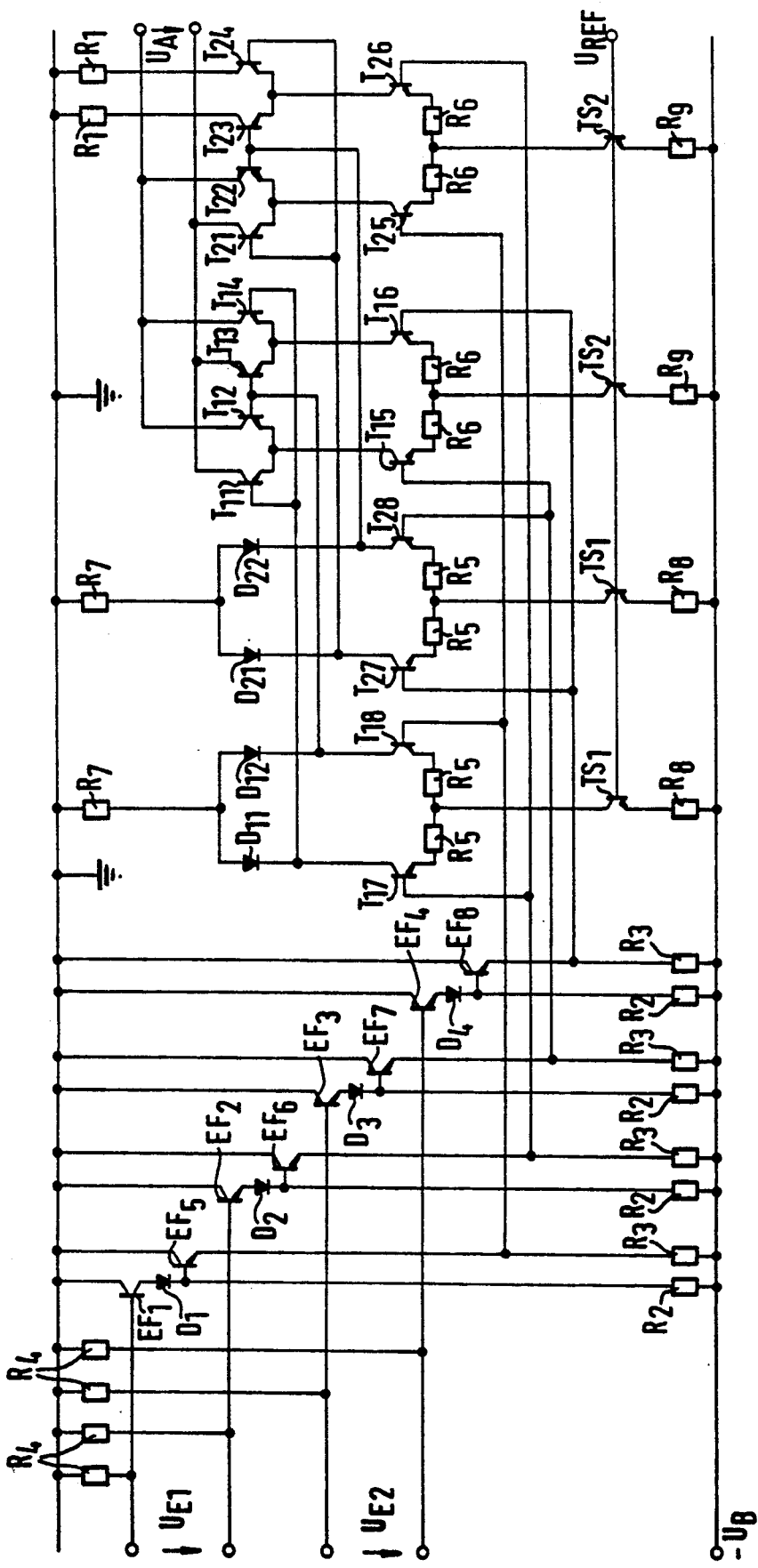
FIG. 3 is a circuit diagram of a modification of the Exclusive-Or gate of FIG. 2 to provide a multiplier.

With slight modifications, the XOR gate according to FIG. 2 can advantageously also be employed as an analog multiplier. These modifications are shown in FIG. 3 which, in principle, shows the circuit arrangement of FIG. 2, supplemented by a few additional components. If two additions to the circuit concept of FIG. 2 are made, the circuit constitutes an analog multiplier having a large dynamic range for the input voltages. These two additions are the following:

Firstly, in order to increase the linearity range of the current switches in the upper plane, that is, for transistors $T_{11}$ to $T_{14}$ and $T_{21}$ to $T_{24}$, the circuit arrangement is expanded by two predistortion stages.

Secondly, feedback resistors $R_6$ are included in the two current switches of the lower current switching plane of the current switch groups, that is, transistors $T_{15}$, $T_{16}$ and $T_{25}$, $T_{26}$, so as to increase the linearity range. This measure is also used for the predistortion members, namely by means of feedback resistors $R_5$ for transistors $T_{17}$ and $T_{18}$ of the first predistortion stage and transistors $T_{27}$ and $T_{28}$ of the second predistortion stage. The emitters of the two pairs of current switches of the predistortion stages are each connected by way of these feedback resistors $R_5$ with the current sources composed of $TS_1$ and their emitter resistances $R_8$. The collectors of the mentioned current switching transistors are connected via diode pairs $D_{11}$, $D_{12}$ and $D_{21}$, $D_{22}$ and level shifting resistors $R_7$ with the positive pole, ground, of the operating voltage source. The signals required to enable the upper current switching plane are picked up at the connection points between the diodes and their collectors, with the bases of the transistor pairs of the upper current switching plane in each case being connected with one another in a crosswise manner and with the associated collector of the corresponding predistortion stage. The enabling or driving signals for the predistortion stages, like the enabling signals for the lower current switching plane, are picked up subsequent to the emitter follower pairs $EF_5$, $EF_6$ and $EF_7$, $EF_8$. The taps following emitter follower pairs $EF_1$, $EF_2$ and $EF_3$, $EF_4$ which, in the double XOR gate according to FIG. 2, are required to enable the upper current switches, are not needed here.

The advantages of the double XOR gate apply to the same degree also for the multiplier.

The increased number of transistors required compared to prior art multiplier concepts does not constitute a significant drawback for monolithic integration.

What I claim is:

1. A circuit arrangement for Exclusively Or-ing first and second input signals, comprising:
    a first input stage which receives the first input signal, the first input stage including at least one transistor and at least one diode;
    at least one first emitter follower connected to the at least one diode of the first input stage;
    a second input stage which receives the second input signal, the second input stage including at least one transistor and at least one diode;
    at least one second emitter follower connected to the at least one diode of the second input stage;
    a pair of current sources;
    a first current switch stage connected to the first input stage;
    a second current switch stage connected to the second input stage, the second current switch stage having circuitry identical to the first current switch stage;
    another first current switch stage connected to the at least one first emitter follower, the another first current switch stage being connected between one of the current sources and the second current switch stage;
    another second current switch stage connected to the at least one second emitter follower, the another second current switch stage being connected between the other of the current sources and the first current switch stage, the another second current switch stage having circuitry identical to the another first current switch stage; and at least one load resistance member connected to the first current switch stage and the second current switch stage.

2. The circuit arrangement of claim 1, wherein the first input stage has two transistors with emitters and two diodes, the diodes being connected to the emitters of respective transistors, wherein the first input stage further comprises two resistance members, each connected to a respective diode, wherein the second input stage has circuitry identical to the first input stage, and wherein the resistance members of the first and second input stages have substantially identical resistance values.

3. The circuit arrangement of claim 2, wherein there are two first emitter followers and two second emitter followers, each including a transistor with an emitter and a resistance member connected to the emitter, and wherein the resistance members of the first and second emitter followers have substantially identical resistance values.

4. The circuit arrangement of claim 1, wherein the current through each of the current sources is substantially the same.

5. The circuit arrangement of claim 1, further comprising means, including a pair of operating voltage source poles, for receiving power and applying a potential difference between the pair of operating voltage source poles, the current sources being connected to one of the operating voltage source poles and the at least one load resistance member being connected to the other of the operating voltage source poles.

6. The circuit arrangement of claim 1, wherein the first current switch stage comprises four transistors having collectors, wherein the second current switch stage comprises four transistors having collectors, wherein there are two load resistance members having substantially identical resistance values, wherein one of the load resistance members is connected to the collectors of two of the transistors of the first current switch stage and to the collectors of two of the transistors of the second current switch stage, and wherein the other load resistance member is connected to the collectors of the other two transistors of the first current switch stage and to the collectors of the other two transistors of the second current switch stage.

7. The circuit arrangement of claim 1, wherein the first input stage includes two transistors and two diodes, wherein the second input stage has circuitry identical to the first input stage, wherein there are two first emitter followers, each connected to a respective diode of the first input stage, and wherein there are two second emitter followers, each connected to a respective diode of the second input stage.

8. The circuit arrangement of claim 1, wherein the arrangement is configured to E²CL technology.

9. A circuit arrangement for multiplying first and second input signals, comprising:
a first input stage which receives the first input signal, the first input stage including at least one transistor and at least one diode;
at least one first emitter follower connected to the at least one diode of the first input stage;
a second input stage which receives the second input signal, the second input stage including at least one transistor and at least one diode;
at least one second emitter follower connected to the at least one diode of the second input stage;
a first predistortion stage connected to the at least one first emitter follower, the first predistortion stage including at least one feedback resistance member;
a second predistortion stage connected to the at least one second emitter follower, the second predistortion stage including at least one feedback resistance member;
a pair of current sources;
a first current switch stage connected to the first predistortion stage;
a second current switch stage connected to the second predistortion stage, the second current switch stage having circuitry identical to the first current switch stage;
another first current switch stage connected to the at least one first emitter follower, the another first current switch stage including at least one feedback resistance member and being connected between one of the current sources and the second current switch stage;
another second current switch stage connected to the at least one second emitter follower, the another second current switch stage including at least one feedback resistance member and being connected between the other of the current sources and the first current switch stage, the another second current switch stage having circuitry identical to the another first current switch stage; and
at least one load resistance member connected to the first current switch stage and the second current switch stage.

10. The circuit arrangement of claim 9, further comprising means, including a pair of operating voltage source poles, for receiving power and applying a potential difference between the pair of operating voltage source poles, the current sources being connected to one of the operating voltage source poles and the at least one load resistance member being connected to the other of the operating voltage source poles.

11. The circuit arrangement of claim 10, wherein the first input stage additionally includes at least one resistance member connected between the base of the at least one transistor of the first input stage and said other of the operating voltage source poles, and wherein the second input stage additionally includes at least one resistance member connected between the base of the at least one transistor of the first input stage and said other of the operating voltage source poles.

12. The circuit arrangement of claim 9, wherein there are two first emitter followers, each including a transistor with an emitter, wherein there are two second emitter followers, each including a transistor with an emitter, wherein the first predistortion stage comprises two transistors with bases that are connected to the emitters of the first emitter followers, wherein the another first current switch stage comprises two transistors with bases that are connected to the emitters of the first emitter followers, wherein the second predistortion stage comprises two transistors with bases that are connected to the emitters of the second emitter followers, and wherein the another second current switch stage comprises two transistors with bases that are connected to the emitters of the second emitter followers.

13. The circuit arrangement of claim 9, wherein the first predistortion stage comprises two transistors with collectors, a resistance member, and two decoupling diodes, each decoupling diode of the first predistortion stage connecting the resistance member of the first predistortion stage with the collector of a respective one of the transistors of the first predistortion stage, and wherein the second predistortion stage comprises two transistors with collectors, a resistance member, and two decoupling diodes, each decoupling diode of the second predistortion stage connecting the resistance member of the second predistortion stage with the collector of a respective one of the transistors of the second predistortion stage.

14. The circuit arrangement of claim 9, further comprising another pair of current sources, one current source of the another pair being connected to the first predistortion stage and the other current source of the another pair being connected to the second predistortion stage.

15. The arrangement of claim 9, wherein the first predistortion stage comprises two transistors with collectors, wherein the first current switch stage comprises four transistors with bases, the bases of two of the transistors of the first current switch stage being connected to the collector of one of the transistors of the first predistortion stage and the bases of the other two transistors of the first current switch stage being connected to the collector of the other transistor of the first predistortion stage, wherein the second predistortion stage comprises two transistors with collectors, and wherein the second current switch stage comprises four transistors with bases, the bases of two of the transistors of the second current switch stage being connected to the collector of one of the transistors of the second predistortion stage and the bases of the other two transistors of the second current switch stage being connected to the collector of the other transistor of the second predistortion stage.

16. The circuit arrangement of claim 9, wherein the arrangement is configured in $E^2CL$ technology.

17. The circuit arrangement of claim 9, wherein the first current switch stage comprises four transistors having collectors, wherein the second current switch stage comprises four transistors having collectors, wherein there are two load resistance members, having substantially identical resistance values, wherein one of the load resistance members is connected to the collectors of two of the transistors of the first current switch stage and to the collectors of two of the transistors of the second current switch stage, and wherein the other load resistance member is connected to the collectors of the other two transistors of the first current switch stage and to the collectors of the other two transistors of the second current switch stage.

18. The circuit arrangement of claim 9, wherein the first input stage includes two transistors and two diodes, wherein the second input stage has circuitry identical to the first input stage, wherein there are two first emitter followers, each connected to a respective diode of the first input stage, and wherein there are two second emitter followers, each connected to a respective diode of the second input stage.

19. The circuit arrangement of claim 9, wherein the first predistortion stage has two feedback resistance members and further comprises two transistors with emitters, each feedback resistance member of the first predistortion stage being connected to the other feedback resistance member of the first predistortion stage and to the emitter of a respective transistor of the first predistortion stage, wherein the second predistortion stage has circuitry identical to the first predistortion stage, wherein the another first current switch stage has two feedback resistance members and further comprises two transistors with emitters, each feedback resistance member of the another first current switch stage being connected to the other feedback resistance member of the another first current switch stage and to the emitter of a respective transistor of the another first current switch stage, and wherein the second another current switch stage has circuitry identical to the another first current switch stage.

* * * * *